United States Patent
Park et al.

(10) Patent No.: US 10,930,642 B2
(45) Date of Patent: Feb. 23, 2021

(54) OFFSET GATE METAL OXIDE SWITCHING TRANSISTOR DEVICE FOR USE IN MEDICAL DEVICE APPLICATIONS

(71) Applicant: DPIX, LLC, Colorado Springs, CO (US)

(72) Inventors: Jungwon Park, Colorado Springs, CO (US); Ick-Hwan Ko, Colorado Springs, CO (US); Byung-Kyu Park, Colorado Springs, CO (US)

(73) Assignee: DPIX, LLC, Colorado Springs, CO (US)

( * ) Notice: Subject to any disclaimer, the term of this patent is extended or adjusted under 35 U.S.C. 154(b) by 0 days.

(21) Appl. No.: 16/549,448

(22) Filed: Aug. 23, 2019

(65) Prior Publication Data

US 2020/0075577 A1   Mar. 5, 2020

Related U.S. Application Data

(60) Provisional application No. 62/726,731, filed on Sep. 4, 2018.

(51) Int. Cl.
H01L 27/02 (2006.01)
H01L 27/146 (2006.01)

(52) U.S. Cl.
CPC ...... *H01L 27/0266* (2013.01); *H01L 27/0292* (2013.01); *H01L 27/14603* (2013.01); *H01L 27/14616* (2013.01); *H01L 27/14643* (2013.01)

(58) Field of Classification Search
CPC ............ H01L 27/0266; H01L 27/0292; H01L 27/14694; H01L 27/0296; H01L 27/14603; H01L 27/14643
See application file for complete search history.

(56) References Cited

U.S. PATENT DOCUMENTS

| | | | |
|---|---|---|---|
| 9,093,966 B1* | 7/2015 | Newton | H02H 9/046 |
| 2014/0145625 A1* | 5/2014 | Yamazaki | H01L 27/124 315/172 |
| 2020/0211425 A1* | 7/2020 | Yamazaki | G02F 1/1368 |

* cited by examiner

*Primary Examiner* — Changhyun Yi
(74) *Attorney, Agent, or Firm* — Slater Matsil, LLP (57) ABSTRACT

An image sensor array includes pixels arranged in rows and columns, wherein each pixel includes a transistor serially coupled to a photodiode, data lines coupled to a first node of the pixel, bias lines coupled to a second node of the pixel, gate lines coupled to a third node of the pixel, and electrostatic-discharge (ESD) circuits coupled between the gate lines and an ESD bus, wherein the ESD circuits each include first and second metal oxide offset bottom gate transistors in parallel connection.

17 Claims, 5 Drawing Sheets

OFFSET GATE METAL OXIDE SWITCHING TRANSISTOR DEVICE FOR USE IN MEDICAL DEVICE APPLICATIONS

CROSS-REFERENCE TO RELATED APPLICATIONS

This application claims the benefit of U.S. Provisional Application No. 62/726,731, filed on Sep. 4, 2018, which application is hereby incorporated herein by reference.

TECHNICAL FIELD

The present invention relates generally to a system and method for an image sensor including an offset bottom gate metal oxide switching transistor device, wherein the image sensor can be used for medical applications.

BACKGROUND

Metal oxide semiconductor materials have been used as the channel layer of thin film transistors (TFTs) since it has a fast switching speed with higher field effect mobility compared to that of amorphous silicon. The bottom gate TFT structure is widely used in amorphous silicon based backplane architectures for medical imaging detectors and in the display industry.

Metal oxide semiconductor TFTs, however, can have current-to-voltage characteristics that increase power consumption of the medical imaging detector and other current-to-voltage characteristics that limit performance of the medical imaging detector.

SUMMARY

A fast switching, high signal-to-noise (S/N) performance, low power consumption, and stable performance medical diagnosis device is achievable by adopting a metal oxide channel device in an imaging detector. By adopting the metal oxide channel material rather than a conventional amorphous silicon material, a high mobility device is realized. By applying an offset bottom gate metal oxide switching device rather than the conventional self-aligned bottom gate structure, even further performance improvements are realized including even faster switching speeds, a high S/N ratio performance, low power consumption, and stable device operations.

In an embodiment, an electro-static discharge (ESD) circuit comprises a plurality of offset bottom gate transistors, wherein the plurality of offset bottom gate transistors comprises first and second offset bottom gate transistors in parallel connection, wherein the plurality of offset bottom gate transistors comprises a plurality of metal oxide offset bottom gate transistors, and wherein the plurality of metal oxide offset bottom gate transistors can comprise a plurality of indium gallium zinc oxide bottom gate transistors.

In another embodiment, an image sensor device comprises an active image sensing array and an electro-static (ESD) circuit, wherein the ESD circuit comprises a plurality of offset bottom gate transistors, wherein the plurality of offset bottom gate transistors comprises first and second offset bottom gate transistors in parallel connection, wherein the plurality of offset bottom gate transistors comprises a plurality of metal oxide offset bottom gate transistors, wherein the plurality of metal oxide offset bottom gate transistors can comprise a plurality of indium gallium zinc oxide offset bottom gate transistors, wherein the active image sensing array can comprise a plurality of offset bottom gate transistors, and wherein the plurality of offset bottom gate transistors can comprise a plurality of metal oxide offset bottom gate transistors.

In another embodiment, an image sensor array comprises a plurality of pixels arranged in rows and columns, wherein each pixel comprises a transistor serially coupled to a photodiode; a plurality of data lines coupled to a first node of the pixel; a plurality of bias lines coupled to a second node of the pixel; a plurality of gate lines coupled to a third node of the pixel; and a plurality of electrostatic-discharge (ESD) circuits coupled between the plurality of gate lines and an ESD bus, wherein the ESD circuits each comprise a plurality of offset bottom gate transistors, wherein the plurality of offset bottom gate transistors can comprise first and second offset bottom gate transistors in parallel connection, wherein the plurality of offset bottom gate transistors can comprise a plurality of metal oxide offset bottom gate transistors, wherein the plurality of metal oxide offset bottom gate transistors can comprise a plurality of indium gallium zinc oxide offset bottom gate transistors, wherein the plurality of offset bottom gate transistors can comprise a lateral offset between an edge of a drain or source to an edge of the bottom gate, wherein the lateral offset is with a range of about one to four microns, wherein the plurality of offset bottom gate transistors can each comprise a minimum current characteristic at a zero gate voltage, and wherein the plurality of offset bottom gate transistors can each comprise a substantially negligible parasitic overlap capacitance between the bottom gate and a source or drain electrode. The image sensor array can comprise a plastic or glass substrate.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

According to embodiments, an imaging array using metal oxide offset bottom gate devices for medical applications (for example X-ray imaging) is described. The offset bottom gate devices can be used in both the array and in a corresponding ESD circuit to maximize performance, including maximizing switching speed and reducing power consumption, while still using conventional manufacturing techniques without additional processing steps. The offset bottom gate devices exhibit a shifted current-to-voltage (I-V) characteristic resulting in a negligible or zero current flow at zero gate voltage. In addition, the offset bottom gate devices have very little parasitic capacitance between the bottom gate and the source or drain, which can improve switching speeds. In an embodiment indium gallium zinc oxide (IGZO) can be used for the metal oxide layer in the metal oxide offset bottom gate devices.

Metal oxide films can be used to fabricate fast switching devices that can be used in, for example, an imaging array and in an ESD protection circuit. However, metal oxide films are vulnerable to the excess existence of hydrogen during fabrication since its majority carrier comprises oxygen vacancies. The use of metal oxide films can inevitably induce a large amount of current flow in a back-to-back transistor (parallel connection of two transistors used in, for example, an ESD protection circuit), which is originally built to prevent excess current flowing into the active matrix imaging array. Thus, metal oxide TFTs are made by applying fabrication techniques such as plasma treatments, and thermal annealing to carefully balance the threshold voltage. Due to the high mobility of metal oxide TFTs, shifting the I-V transfer characteristics by shifting the threshold voltage positively has advantages of lower power consumption, faster switching, and high signal to noise (S/N) ratio performance as is explained in further detail below.

Embodiment image arrays have the benefit of high mobility metal oxide based active matrix devices, and the stable operation of metal oxide based back-to-back switching transistors working correctly by proper metal oxide switching transistor design (offset bottom gate). Embodiment image arrays are ideally suited for medical application because of the high mobility and stable operation of the metal oxide films. Furthermore, the offset bottom gate oxide TFT can be used to ensure that the threshold voltage is always at a positive gate voltage. As the oxide channel gets exposed to x-ray radiation, the threshold voltage tends to shift to the negative side. By applying the offset bottom gate structure, the TFT is constrained to always have a positive threshold voltage regardless of the applied radiation dose.

Embodiment concepts provide a design and the method for fabricating a flat panel device such as an imaging array ideally suited for medical applications. The fabrication process uses metal oxide based switching devices, and uses either inorganic or organic photodiodes for the x-ray detection.

As previously discussed, metal oxide films are vulnerable to the excess existence of the inevitable hydrogen produced during fabrication process since its carrier is oxygen vacancies in ionic bonding. Therefore the normal metal oxide device has a more negatively shifted threshold voltage compared to that of amorphous silicon based switching devices. The induced hydrogen creates a coupling of hydrogen-oxygen based compounds, which leads to additional oxygen vacancies in the channel region. The back-to-back switching transistors is an ESD protection circuit of the image array prevents excess current flowing into the active matrix device, which is located between active matrix and periphery tap-automated bonding (TAB), is comprised of gate to drain field effect transistor and a drain to source field effect transistor. When a conventional metal oxide back-to-back switching device (ESD protection circuit) is at an OFF state, i.e. a zero voltage is applied, the back-to-back switching device has an unnecessarily large current flow between each electrode. Therefore the switching device using the conventional metal oxide devices inevitably induces a large amount of current flow through the back-to-back transistor in the OFF state. To advantageously reduce the current flow in the OFF state, an offset bottom gate metal oxide back-to-back transistor design is used in embodiment image arrays. The offset bottom gate metal oxide device can also be used in the image sensor array as previously discussed.

The offset bottom gate metal oxide switching device is designed to have a lateral offset distance between the gate and drain (or source) electrode. In an embodiment, the lateral offset is with a range of about one to four microns. The offset bottom gate, according to embodiments, will ideally have no current flow at the device OFF state since the channel is not formed at the negative bias by the field effect. In the ON state of the device, the channel is formed by building up charges through the gate dielectric capacitance. Although the offset device does not have a continuous channel region between the gate and drain electrode, the offset device turns on by tunneling effects at higher turn on voltages rather than the conventional threshold voltage by tunneling of majority carriers over the field effect region.

Therefore, the use of the metal oxide offset bottom gate device has significant benefits for both the active matrix switching device, and the back-to-back switching transistor. By the nature of the offset bottom gate structure, its threshold voltage is shifted forward in the positive direction and its turn off voltage requirement is much smaller than a conventional device structure. This leads to lower power consumption, low electrical noise, and fast switching speeds from the lower operational range of the voltage input. Another advantage of the offset bottom gate device is less parasitic overlap capacitance formed between gate and drain electrode, in embodiments. A conventional non-offset structure inevitably has a parasitic overlap capacitance between gate and drain electrode even though it is fabricated by using a self-aligning lithographic process. The lower or negligible parasitic overlap capacitance contributes to a lower noise device performance.

Secondly, the offset device leads to a very low leakage current flow of the back-to-back switching transistor when the source-drain current and gate-drain voltage is equal, which achieves the original purpose of the back-to-back switching device by using metal oxide channel material.

To fabricate the offset bottom gate back-to-back switching device, a gate metal electrode is formed by sputter or physical vapor deposition (PVD) and patterned to form the metal line. Subsequently, a dielectric film is deposited to form the gate dielectric film, which is deposited by chemical vapor deposition (CVD) or plasma-enhanced CVD (PEDVD). The gate dielectric film can be silicon dioxide, silicon nitride, or silicon oxynitride or alumina dielectric film. The film thickness can be varied depending on the application. Subsequently, a metal oxide film is deposited by PVD or a solution process. A channel passivation material is then deposited by CVD and patterned by a wet-based process or plasma-based process. The metal oxide channel area is then patterned to form the active area of the device. The next fabrication step is the source/drain metal electrode deposition and patterning by a wet or dry etch method. This step forms the lateral offset of the offset bottom gate device. There is a lateral offset between the drain electrode and the gate electrode, which has no electrode overlap between gate and drain features. Special care should be exercised when aligning the overlay at source and drain electrode formation to make sure that a proper lateral offset is achieved between the gate and drain. Finally, the photodiodes of the array can be formed and coupled to the offset bottom gate devices, and the entire array can be passivated.

Figure 1A:
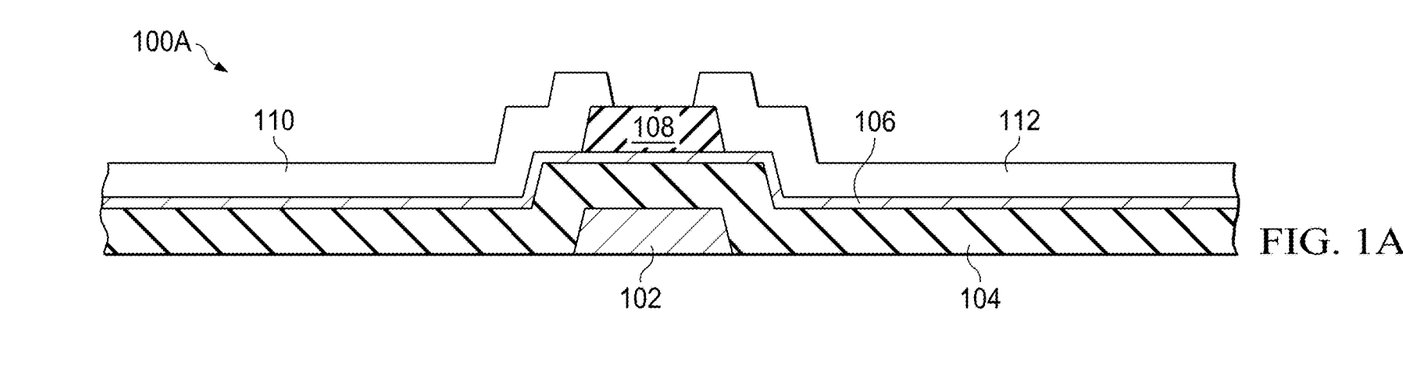
FIG. 1A is a cross-sectional diagram of a conventional bottom gate transistor with channel passivation.

FIG. 1A is a cross-sectional diagram of a conventional metal oxide bottom gate transistor 100A with channel passivation, including a bottom gate electrode 102, a gate dielectric layer 104, a metal oxide layer 106, a patterned channel passivation layer 108, a first source/drain layer no, and a second source/drain layer 112. Note that the conventional bottom gate transistor 1A is symmetrical, and there is an overlap between an edge of the first source/drain layer no and an edge of the patterned channel passivation layer 108, and an overlap between an edge of the second source/drain layer 112 and another edge of the patterned channel passivation layer 108.

Figure 1B:
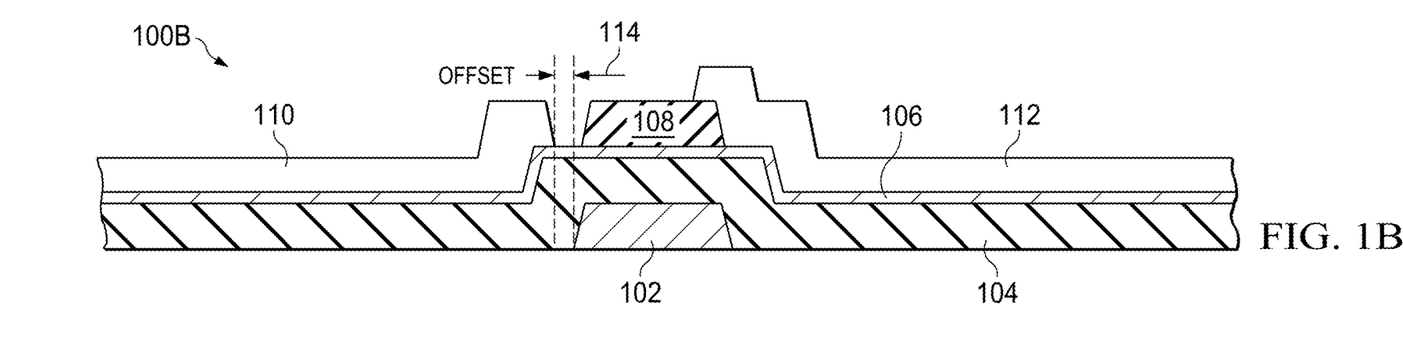
FIG. 1B is a cross-sectional diagram of an offset bottom gate transistor with channel passivation according to an embodiment.

FIG. 1B is a cross-sectional diagram of a metal oxide offset bottom gate transistor 100B with channel passivation according to an embodiment, including a bottom gate electrode 102, a gate dielectric layer 104, a metal oxide layer 106, a patterned channel passivation layer 108, a first source/drain layer no that in an embodiment comprises a drain, and a second source/drain layer 112 that in an embodiment comprises a source. Note that the offset bottom gate transistor 100B is asymmetrical, and there is no overlap between an edge of the first source/drain layer no and an edge of the patterned channel passivation layer 108, although there is an overlap between an edge of the second source/drain layer 112 and another edge of the patterned channel passivation layer 108. Lateral offset 114 between the edge of source/drain layer no and the edge of bottom gate electrode 102 is with a range of about one to four microns. The offset nominal value and range can be changed as required for a specific embodiment. While the patterned channel passivation layer 108 is shown as being offset in FIG. 1B for clarity, it actually extends to the edge of source/drain layer no in an embodiment as is shown, for example, in FIG. 6. However, the gate electrode 102 edge must be offset from the edge of source/drain layer no to obtain the performance benefits described herein.

Figure 1C:
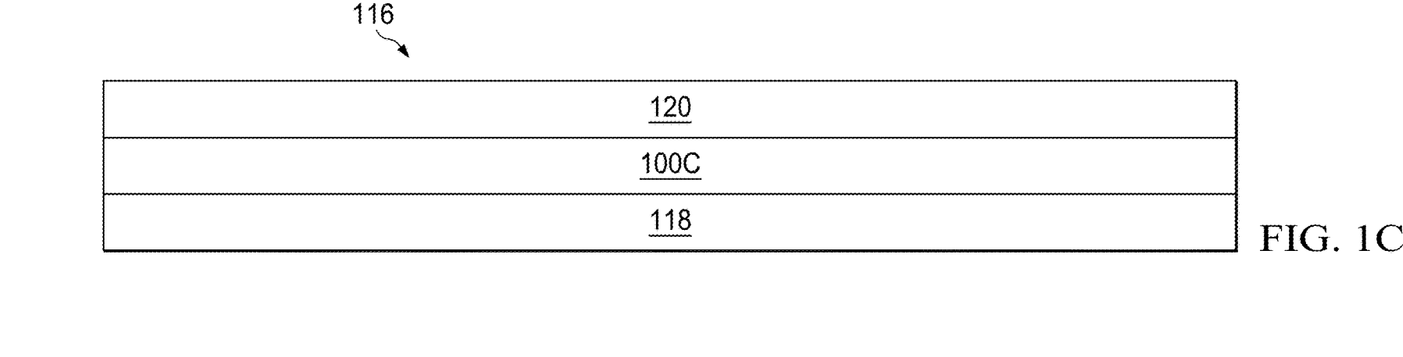
FIG. 1C is a cross-sectional diagram of an image sensor array comprising a plurality of offset bottom gate transistors as shown in FIG. 1B.

FIG. 1C is a cross-sectional diagram of an image sensor array 116 comprising a plurality of offset bottom gate transistors 100B as shown in FIG. 1B. Image sensor array 116 comprises a middle layer 100C comprising a plurality of offset bottom gate transistors 100B, a plurality of photodiodes, metal interconnection layers, and other peripheral circuitry. In an embodiment, bottom layer 118 can comprise a glass or plastic substrate, and other metal interconnect layers. In an embodiment, top layer 120 can comprise bonding pads, interconnection layers, and passivation layers. Each of the three layers 118, 100C, and 120 can include additional structures known in the art such as vias for interconnecting various metal layers and extending through insulating layers, as well as other such structures.

Figure 2A:
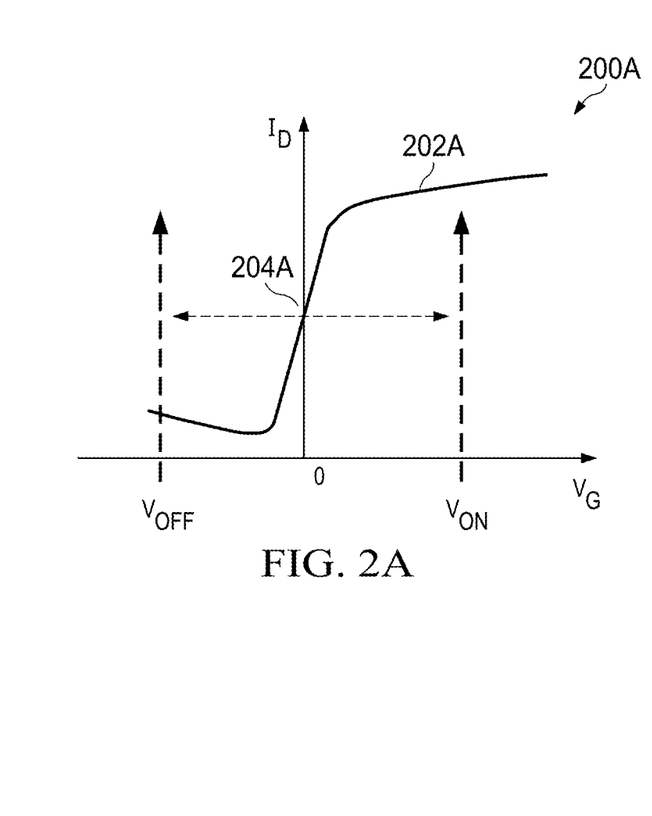
FIG. 2A is a plot of the voltage-current characteristics of a conventional device.

FIG. 2A is a plot of the voltage-current characteristics 200A of a conventional bottom gate device. The conventional bottom gate device has an I-V characteristic plot 202A wherein drain current $I_D$ is plotted versus gate voltage $V_G$ that attains a fully ON state with a positive gate voltage $V_{ON}$. The conventional bottom gate device attains a fully OFF state with a negative gate voltage $V_{OFF}$. At a zero gate voltage, the conventional device is partially conducting with a drain current value at current value 204A.

Figure 2B:
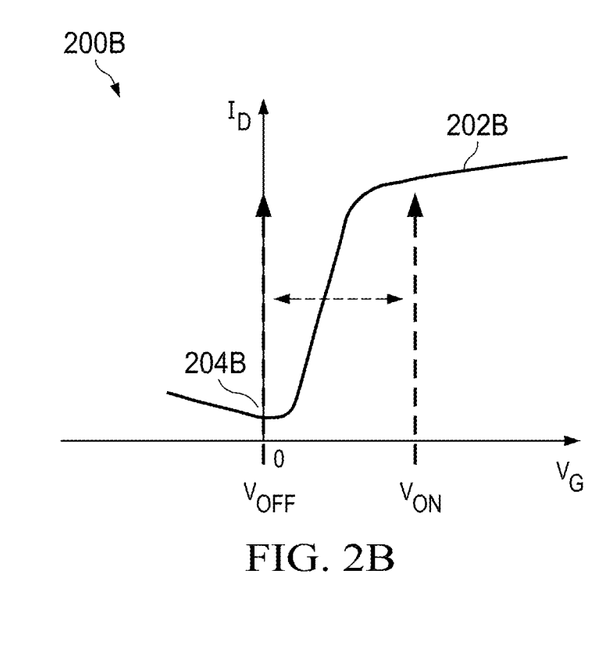
FIG. 2B is a plot of the voltage-current characteristics of an offset bottom gate metal oxide switching device according to an embodiment.

FIG. 2B is a plot of the shifted voltage-current characteristics 200B of an offset bottom gate device, according to an embodiment. The offset bottom gate device has an I-V characteristic plot 202B wherein drain current $I_D$ is plotted versus gate voltage $V_G$ that attains a fully ON state with a positive gate voltage $V_{ON}$. The offset bottom gate device attains a fully OFF state with a slightly negative or zero gate voltage $V_{OFF}$. At a zero gate voltage, if different than the $V_{OFF}$ voltage, the offset device is not conducting with a very low or zero drain current value at current value 204B.

The differing drain currents of the conventional device and the offset device, according to embodiments, is further illustrated with respect to FIGS. 3A and 3B described in further detail below.

Figure 3A:
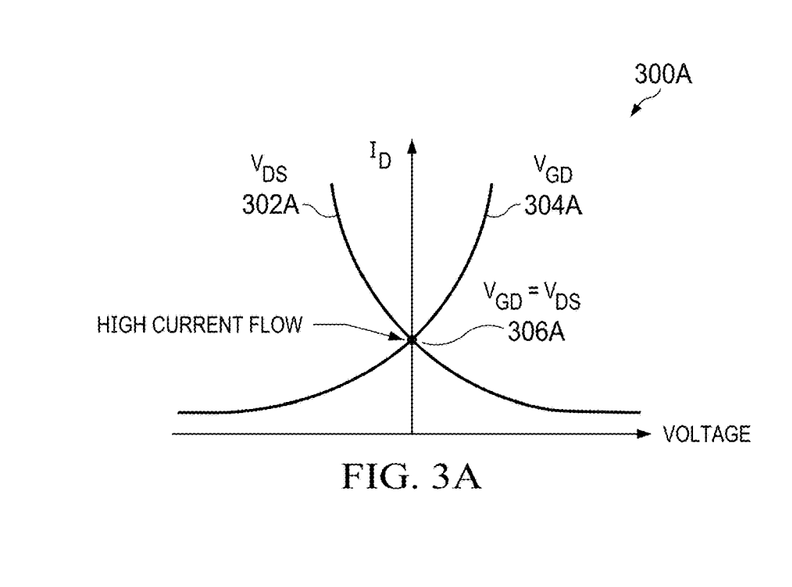
FIG. 3A is a plot of the voltage-current characteristics of a conventional device in a back-to-back transistor circuit or ESD circuit.

FIG. 3A is a plot of the voltage-current characteristics of a conventional device comparing the drain-to-source voltage ($V_{DS}$) to gate-to-drain voltage ($V_{GD}$) plotted across an increasing voltage x-axis, and showing the resulting drain current ($I_D$). Note that for VGD=VDS, a relatively high drain current $I_D$ flows at current level 306A.

Figure 3B:
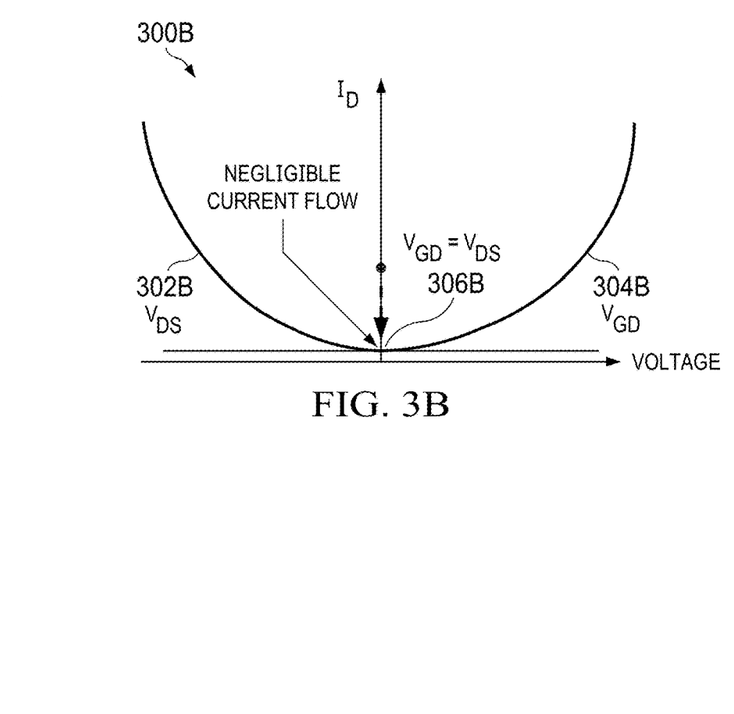
FIG. 3B and a plot of the voltage-current characteristics on an offset bottom gate metal oxide device in a back-to-back transistor circuit or ESD circuit.

FIG. 3B is a plot of the voltage-current characteristics of an offset device comparing the drain-to-source voltage ($V_{DS}$) to gate-to-drain voltage ($V_{GD}$) plotted across an increasing voltage x-axis, and showing the resulting drain current ($I_D$). Note that for VGD=VDS, a relatively negligible or zero drain current $I_D$ flows at current level 306B.

Figure 4:
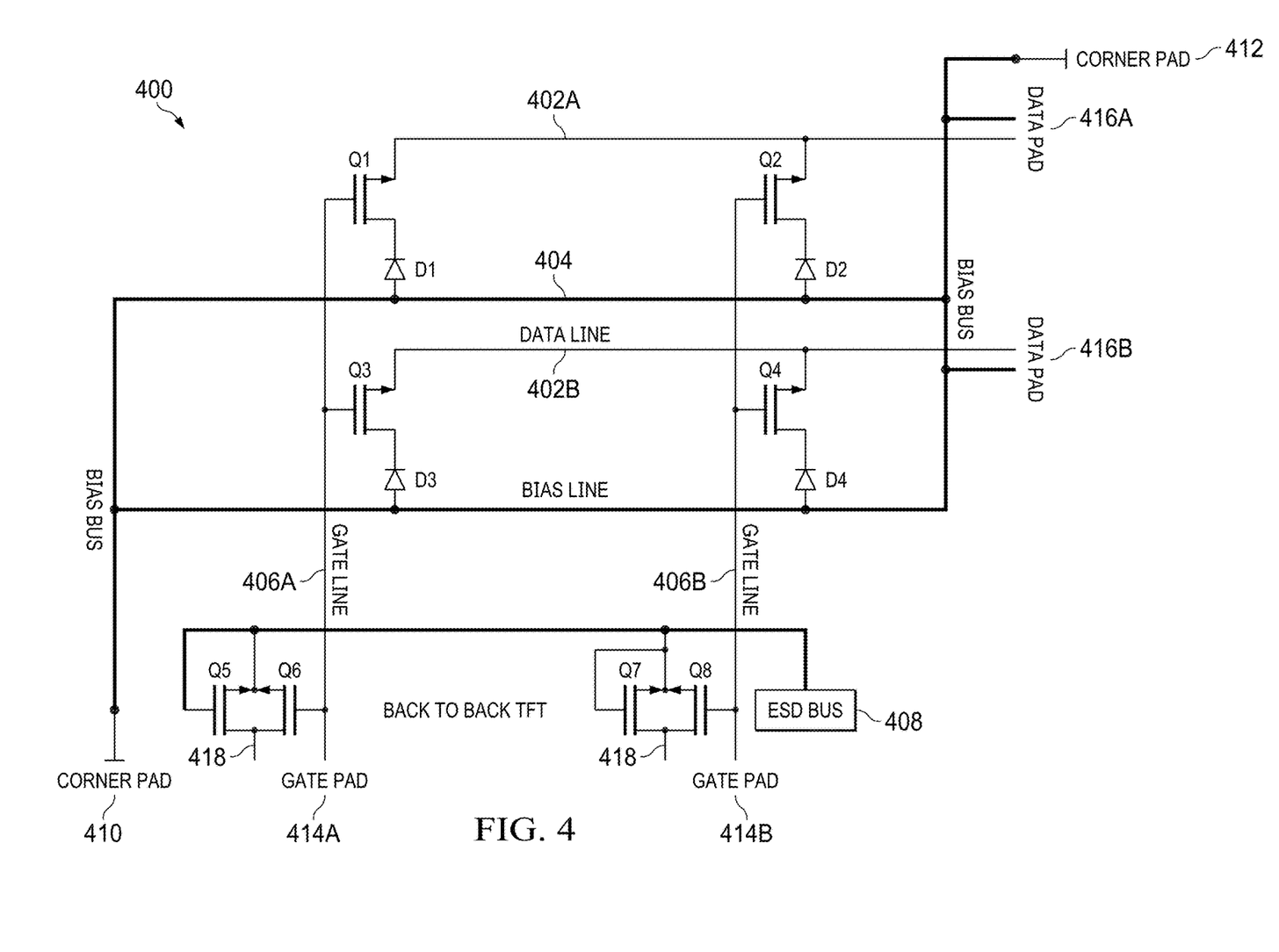
FIG. 4 is a schematic diagram of an image sensor array including an ESD protection circuit according to an embodiment.

FIG. 4 is a schematic diagram of an image sensor array 400 including an ESD protection circuit according to an embodiment, comprising a plurality of pixels Q1/D1, Q2/D2, Q3/D3, and Q4/D4 arranged in rows and columns, wherein each pixel comprises a transistor Q1/Q2/Q3/Q4 serially coupled to a photodiode D1/D2/D3/D4. While only two pixels in each row and each column are shown in FIG. 4, it will be apparent to those skilled in the art that any number of pixels can be used. A plurality of data lines 402A and 402B are coupled to a first node (source of transistors Q1/Q2/Q3/Q4) of the pixel; a plurality of bias lines 404 terminating in a bias bus are coupled to a second node (anode of diode D1/D2/D3/D4) of the pixel; and a plurality of gate lines 406A and 406B are coupled to a third node (gate of transistors Q1/Q2/Q3/Q4) of the pixel. A plurality of electrostatic-discharge (ESD) circuits or back-to-back transistors or parallel-connector transistors (Q5/Q6 and Q7/Q8) are coupled between the plurality of gate lines and an ESD bus 408, wherein the ESD circuits each comprise a plurality of metal oxide offset bottom gate transistors. The coupled sources of the transistors Q5/Q6 and Q7/Q8 and a gate of one of the transistors (Q5/Q7) are coupled to the ESD bus 408, whereas a gate of another of the transistors (Q6/Q8) is coupled to the gate lines, as shown. The coupled drains of the transistors Q5/Q6 and Q7/Q8 are coupled to ground 418, in an embodiment. The bias bus 404 can be terminated in corner bonding pads 410 and 412, in an embodiment. The data lines 402A and 402B can be terminated in data pads 416A and 416B, in an embodiment. The gate lines 406A and 406B can be terminated in gate pads 414A and 414B, in an embodiment.

In an embodiment, the image sensor array 400 can be fabricated on a plastic or glass substrate, and include other peripheral circuitry not shown in FIG. 4. The image sensor array 400 can comprise a plurality of image arrays.

Figure 5:
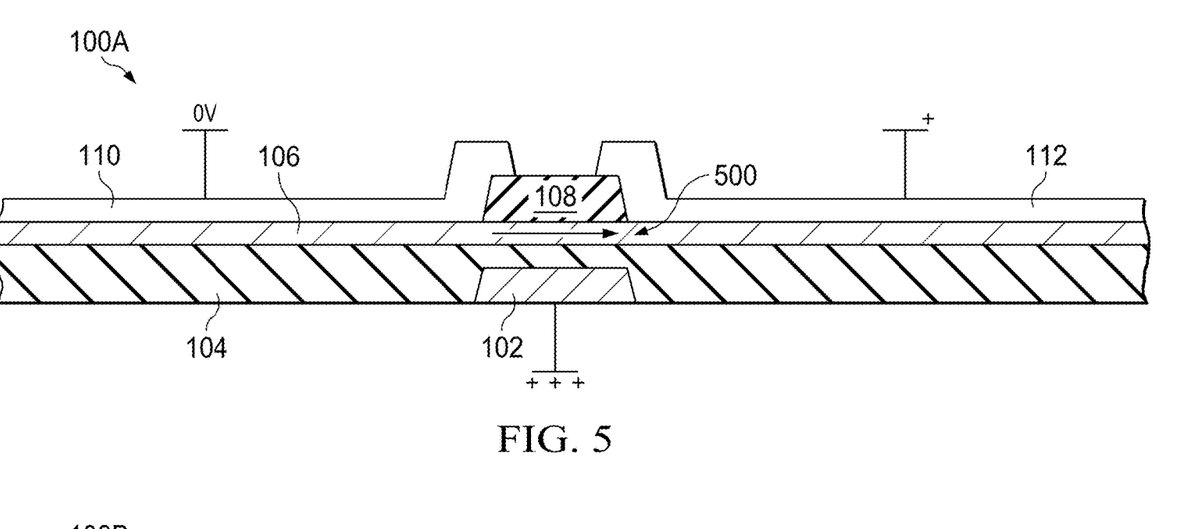
FIG. 5 is a cross-sectional diagram that shows how the channel is formed in a conventional device.

FIG. 5 is a cross-sectional diagram that shows how the channel is formed in a conventional device 100A. A conventional bottom gate device structure 100A is shown including a bottom gate electrode 102 coupled to a high positive voltage, a gate insulator layer 104, a metal oxide layer 106, a channel passivation layer or island 108, a source layer no coupled to ground, and a drain layer 112 coupled to an intermediate positive voltage. Under the biasing conditions shown in FIG. 5, the channel formed under the island 108 establishes a current flow between source no and the drain 112.

Figure 6:
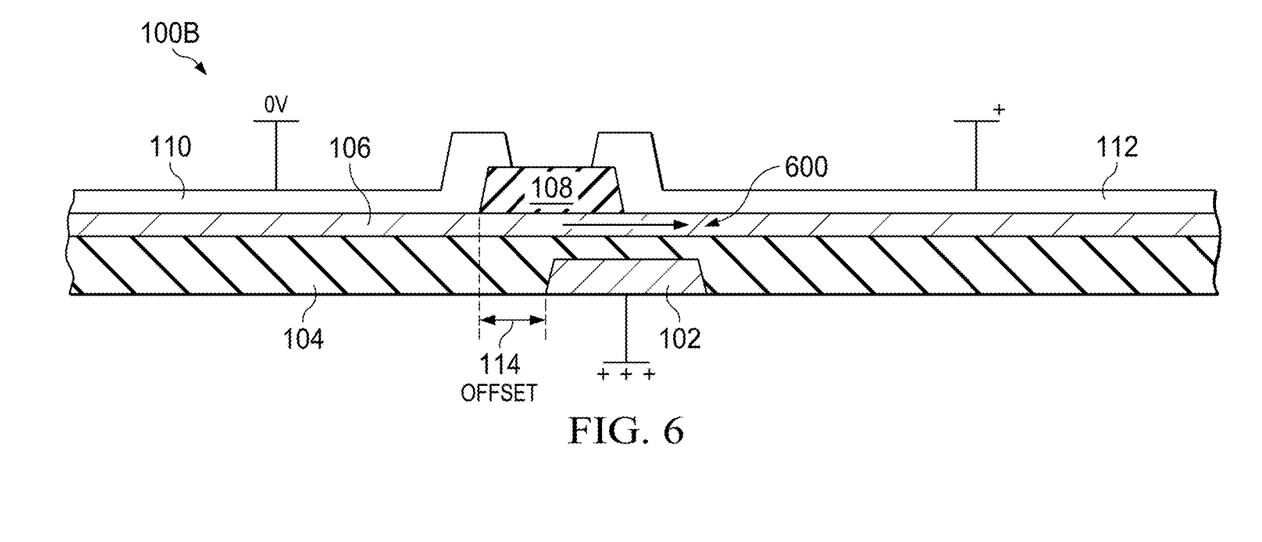
FIG. 6 is a cross-sectional diagram that shows how the channel is formed in the offset device.

FIG. 6 is a cross-sectional diagram that shows how the channel is formed in an embodiment offset device 100B. An offset bottom gate device structure 100B is shown including a bottom gate electrode 102 coupled to a high positive voltage, a gate insulator layer 104, a metal oxide layer 106, a channel passivation layer or island 108, a source layer no coupled to ground, and a drain layer 112 coupled to an intermediate positive voltage. Under the biasing conditions shown in FIG. 5, the channel formed under the island 108 does not by itself establish a current flow between the source no and the drain 112, but the current flow between source and drain is established as a result of a tunneling mechanism as is described above.

Advantages of embodiment concepts include the use of a high mobility device in the array and in the corresponding ESD circuit. A metal oxide channel device is used that has a higher mobility than conventional amorphous silicon based device. It is an advantage that a fast switching device is used because the offset bottom gate structure comprises a smaller operating voltage range that a conventional symmetrical device. It is an advantage that embodiment image arrays have a lower power consumption than conventional image arrays since the offset bottom gate structure comprises a smaller operating voltage range. It is a further advantage that embodiment image sensor arrays achieve a high signal to noise (S/N) ratio since the offset bottom gate structure comprises a smaller operating voltage range, and has no parasitic overlap capacitance between the gate and drain electrodes thus reducing data line capacitance. It is a further advantage of embodiment image sensor arrays that a stable device operation is achieved since less current flows in the metal oxide back-to-back switching device in the OFF state.

Layer thicknesses for the offset bottom gate device, in an embodiment are gate 102: 50 nm to 500 nm; gate insulator 104: 100 nm to 500 nm; IGZO (active layer 106): 25 nm to 500 nm; island 108: 50 nm to 1.0 µm; and source/drain metal 110/112: 50 nm to 500 nm. Other layer thickness and ranges can also be used for a specific application as required.

According to embodiments, the ESD TFTs can be offset bottom gate devices, but the array/pixel TFTs can be offset bottom gate TFTs as well. Metal oxide offset bottom gate devices can be used for the ESD TFTs and for the array/pixel TFTs, wherein the metal oxide layer can comprise IGZO. The source/drain layers can be either a source or a drain in embodiments. The voltage biasing of the TFTs can be changed both in magnitude and polarity in embodiments. The TFTs can be formed on a glass, plastic, or other suitable material substrate.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An electro-static discharge (ESD) circuit comprising a plurality of offset bottom gate transistors, wherein the plurality of offset bottom gate transistors comprises first and second offset bottom gate transistors in direct parallel connection, wherein a drain of the first offset bottom gate transistor is directly coupled to a drain of the second offset bottom gate transistor, and wherein a source of the first offset bottom gate transistor is directly coupled to a source of the second offset bottom gate transistor.

2. The ESD circuit of claim 1, wherein the plurality of offset bottom gate transistors comprises a plurality of metal oxide offset bottom gate transistors.

3. The ESD circuit of claim 2, wherein the plurality of metal oxide offset bottom gate transistors comprises a plurality of indium gallium zinc oxide bottom gate transistors.

4. An image sensor device comprising an active image sensing array and an electro-static (ESD) circuit, wherein the ESD circuit comprises a plurality of offset bottom gate transistors, wherein the plurality of offset bottom gate transistors comprises first and second offset bottom gate transistors in direct parallel connection, wherein a drain of the first offset bottom gate transistor is directly coupled to a drain of the second offset bottom gate transistor, wherein a source of the first offset bottom gate transistor is directly coupled to a source of the second offset bottom gate transistor, wherein a gate of the first offset bottom gate transistor is coupled to an ESD bus, and wherein a gate of the second offset bottom gate transistor is coupled to the active image sensing array.

5. The image sensor device of claim 4, wherein the plurality of offset bottom gate transistors comprises a plurality of metal oxide offset bottom gate transistors.

6. The image sensor device of claim 5, wherein the plurality of metal oxide offset bottom gate transistors comprises a plurality of indium gallium zinc oxide offset bottom gate transistors.

7. The image sensor device of claim 4, wherein the active image sensing array comprises a plurality of offset bottom gate transistors.

8. The image sensor device of claim 7, wherein the plurality of offset bottom gate transistors comprises a plurality of metal oxide offset bottom gate transistors.

9. An image sensor array, comprising:
a plurality of pixels arranged in rows and columns, wherein each pixel comprises a transistor serially coupled to a photodiode;
a plurality of data lines coupled to a first node of the pixel;
a plurality of bias lines coupled to a second node of the pixel;
a plurality of gate lines coupled to a third node of the pixel; and
a plurality of electrostatic-discharge (ESD) circuits coupled between the plurality of gate lines and an ESD bus, wherein the ESD circuits each comprise a plurality of offset bottom gate transistors, wherein the plurality of offset bottom gate transistors comprises first and second offset bottom gate transistors in direct parallel connection, wherein a drain of the first offset bottom gate transistor is directly coupled to a drain of the second offset bottom gate transistor, and wherein a source of the first offset bottom gate transistor is directly coupled to a source of the second offset bottom gate transistor.

10. The image sensor array of claim 9, wherein the plurality of offset bottom gate transistors comprise a plurality of metal oxide offset bottom gate transistors.

11. The image sensor array of claim 10, wherein the plurality of metal oxide offset bottom gate transistors comprises a plurality of indium gallium zinc oxide offset bottom gate transistors.

12. The image sensor array of claim 9, wherein the plurality of offset bottom gate transistors comprises a lateral offset between an edge of a drain or source to an edge of a bottom gate of the plurality of offset bottom gate transistors.

13. The image sensor array of claim 9, wherein a lateral offset of the plurality of offset bottom gate transistors is within a range of about one to four microns.

14. The image sensor array of claim 9, wherein the plurality of offset bottom gate transistors each comprise a minimum current characteristic at a zero gate voltage.

15. The image sensor array of claim 9, wherein the plurality of offset bottom gate transistors each comprise a substantially negligible parasitic overlap capacitance between a bottom gate and a source or drain electrode.

16. The image sensor array of claim 9, further comprising a plastic substrate.

17. The image sensor array of claim 9, further comprising a glass substrate.

\* \* \* \* \*